United States Patent
Yano et al.

(10) Patent No.: US 7,540,976 B2
(45) Date of Patent: *Jun. 2, 2009

(54) SPUTTERING TARGET FOR FORMING THIN PHOSPHOR FILM

(75) Inventors: Yoshihiko Yano, Tokyo (JP); Tomoyuki Oike, Tokyo (JP); Naruki Kataoka, Tokyo (JP); Masaki Takahashi, Tokyo (JP); Yukio Kawaguchi, Tokyo (JP)

(73) Assignee: Ifire IP Corporation (CA)

( * ) Notice: Subject to any disclaimer, the term of this patent is extended or adjusted under 35 U.S.C. 154(b) by 4 days.

This patent is subject to a terminal disclaimer.

(21) Appl. No.: 10/548,476

(22) PCT Filed: Mar. 5, 2004

(86) PCT No.: PCT/JP2004/002803

§ 371 (c)(1),
(2), (4) Date: May 24, 2006

(87) PCT Pub. No.: WO2004/080128

PCT Pub. Date: Sep. 16, 2004

(65) Prior Publication Data

US 2006/0254462 A1    Nov. 16, 2006

(30) Foreign Application Priority Data

Mar. 6, 2003    (JP)    .................... 2003-060601

(51) Int. Cl.
| C09K 11/02 | (2006.01) |
| C09K 11/77 | (2006.01) |
| C09K 11/56 | (2006.01) |
| C09K 11/54 | (2006.01) |
| C09K 11/72 | (2006.01) |
| C23C 14/00 | (2006.01) |
| C25B 11/00 | (2006.01) |
| C25B 13/00 | (2006.01) |
| B32B 9/00 | (2006.01) |
| B32B 19/00 | (2006.01) |
| C04B 14/00 | (2006.01) |
| C09C 1/04 | (2006.01) |

(52) U.S. Cl. .................. 252/301.4 S; 252/301.4 R; 252/301.6 R; 252/301.6 S; 204/298.12; 204/298.13; 428/690; 428/917; 106/422; 106/424; 106/425; 106/426; 106/427

(58) Field of Classification Search .......... 252/301.4 S, 252/301.4 R, 301.6 R, 301.6 S; 428/690, 428/917; 106/422–427; 204/298.12, 298.13
See application file for complete search history.

(56) References Cited

U.S. PATENT DOCUMENTS

| 6,254,740 | B1 * | 7/2001 | Kato et al. ............. 204/192.25 |
| 6,447,654 | B1 * | 9/2002 | Kosyachkov ........... 204/192.15 |
| 6,617,782 | B2 | 9/2003 | Cheong et al. |
| 6,686,062 | B2 | 2/2004 | Cheong et al. |
| 6,793,782 | B2 | 9/2004 | Kosyachkov |
| 6,841,045 | B2 | 1/2005 | Kosyachkov |
| 6,919,682 | B2 | 7/2005 | Cheong et al. |
| 7,011,896 | B2 * | 3/2006 | Yano et al. .................. 428/690 |
| 2003/0224221 | A1 | 12/2003 | Cheong et al. |
| 2004/0013906 | A1 | 1/2004 | Stiles et al. |

FOREIGN PATENT DOCUMENTS

| JP | 07-122364 | 5/1995 |
| JP | 8-12970 | 1/1996 |
| JP | 08-12970 | 1/1996 |
| JP | 08-134440 | 5/1996 |
| JP | 8-330069 | 12/1996 |
| JP | 2001-118677 | * 4/2001 |
| JP | 2003-003162 | 1/2003 |
| JP | 2003-3162 A | 1/2003 |
| JP | 2003-301171 | 10/2003 |
| JP | 2003-301171 A | 10/2003 |

OTHER PUBLICATIONS

Yano (JP2001-118677) Published Apr. 27, 2001 (Machine translation).*
International Preliminary Report on Patentability issued Feb. 13, 2006.

Shingaku Giho, EID98-113, pp. 19-24 translation of Kawanishi et al., "CaAl$_2$S$_4$: Ce thin Film EL debvices prepared by the two targets pulse electron-beam evaporation", Jan. 1999.

Miura, et al., "High-Luminance Blue-Emitting BaAl2S4: Eu Thin-Film Electroluminescent Devices", *Jpn. J. Appl. Phys.*, vol. 38 pp. L1291-L1292 (1999).

Ohnishi, H., "11.1: Invited Address: Color TFEL Devices Grown by Sputtering", *SID 94 Digest*, pp. 129-132 (1994).

Notice of Allowance issued on Jan. 27, 2009 in connection with corresponding Japanese patent application No. P2003-060601 with English language translation (References 1-3 were previously filed in an IDS dated Sep. 6, 2005 and Reference 5 was previously submitted in an IDS dated Sep. 27, 2005 and are therefore not enclosed).

\* cited by examiner

*Primary Examiner*—Kevin P Kerns
*Assistant Examiner*—John A Hevey
(74) *Attorney, Agent, or Firm*—Ostrolenk, Faber, Gerb & Soffen, LLP

(57) ABSTRACT

A sputtering target for fluorescent thin-film formation comprising a matrix material and a luminescent center material, wherein said matrix material has a chemical composition represented by the following formula (1), and simultaneously satisfies conditions represented by the following inequalities (2) to (5).

$$M^{II}_v A_x B_y O_z S_w \qquad (1)$$

$$0.05 \leq v/x \leq 5 \qquad (2)$$

$$1 \leq y/x \leq 6 \qquad (3)$$

$$0.01 \leq z/(z+w) \leq 0.85 \qquad (4)$$

$$0.6 \leq (v+x+3y/2)/(z+w) \leq 1.5 \qquad (5)$$

wherein $M^{II}$ represents one or more elements selected from the group consisting of Zn, Cd and Hg, A represents one or more elements selected from the group consisting of Mg, Ca, Sr, Ba and rare earth elements, B represents one or more elements selected from the group consisting of Al, Ga and In, and v, x, y, z and w each represent numerical values satisfying the conditions specified in the inequalities (2) to (5).

4 Claims, 2 Drawing Sheets

SPUTTERING TARGET FOR FORMING THIN PHOSPHOR FILM

CROSS REFERENCE TO RELATED APPLICATION

The present application is a 35 U.S.C. §371 national phase conversion of PCT/JP2004/002803 filed Mar. 5, 2004, which claims priority of Japanese application no. P2003-002803 filed Mar. 6, 2003, which are incorporated herein in their entirety.

TECHNICAL FIELD

The present invention relates to a sputtering target for fluorescent thin-film formation, to be employed for fabrication of fluorescent thin-films provided in light-emitting devices such as EL (electroluminescent) elements, by sputtering.

BACKGROUND ART

A great deal of research has been conducted in recent years on thin-film EL elements as small or large/lightweight flat display panels. Monochrome thin-film EL displays employing fluorescent thin-films composed of yellowish-orange emitting manganese-added zinc sulfide are already implemented, in forms with a bilayer insulating structure using thin-film insulating layers 4A, 4B as shown in FIG. 2. FIG. 2 shows a lower electrode 3A with a prescribed pattern formed on a base 2 made of glass, with a dielectric thin-film formed as a lower insulating layer 4A on the lower electrode 3A. Also, a luminescent layer 5 made of a fluorescent thin-film and an upper insulating layer 4B are formed in that order on the lower insulating layer 4A, while an upper electrode 3B is formed with a prescribed pattern on the upper insulating layer 4B, forming a matrix with the lower electrode 3A. The fluorescent thin-film is usually subjected to annealing treatment below the distortion point of the glass base 2, for enhanced brightness.

Recently there has been proposed a structure wherein the base 2 is composed of ceramic, and a thick-film dielectric layer is used as the lower insulating layer 4. There have also been proposed element structures wherein a high dielectric $BaTiO_3$ thin-sheet is used as the base and an electrode is formed on the back side of the base, where the thin-sheet is used as both the insulating layer and base. Since ceramics such as alumina or $BaTiO_3$ are employed as the bases in such structures, it is possible to carry out high temperature annealing of the fluorescent thin-film, permitting a higher degree of brightness. In addition, because such structures employ thick-film or thin-sheet dielectric layers as insulating layers, they typically can yield elements with greater resistance to dielectric breakdown and higher reliability compared to EL elements using thin-films as insulating layers. It is not necessary in all cases for the structure to be one in which the fluorescent thin-film is sandwiched by insulating layers as in bilayer insulated structures. That is, the insulating layer may be provided as a thick-film or thin-sheet dielectric layer on only one side of the fluorescent thin-film.

Color display is indispensable for applications to personal computer, TV and other display purposes. Thin-film EL displays employing sulfide fluorescent thin-films have high reliability and environmental resistance, but at the current time EL fluorescent bodies which emit the 3 primary colors of red, green and blue exhibit insufficient characteristics and are still unsuitable for color display. Potential blue-emitting fluorescent bodies include those employing SrS as the matrix material and Ce as the luminescent center material (hereinafter indicated as "SrS:Ce"), or $SrGa_2S_4$:Ce, ZnS:Tm or the like. Potential red-emitting fluorescent bodies include ZnS:Sm, CaS:Eu and the like. Potential green-emitting fluorescent bodies include ZnS:Tb, CaS:Ce and the like. Research on these materials is currently underway.

Thiogallate-type or thioaluminate-type blue fluorescent bodies such as $SrGa_2S_4$:Ce, $CaGa_2S_4$:Ce, $BaAl_2S_4$:Eu and the like are disclosed in Japanese Patent Application Laid-Open No. HEI 7-122364, Japanese Patent Application Laid-Open No. HEI 8-134440, Shingaku Giho EID98-113, pp. 19-24 and Jpn. J. Appl. Phys. Vol. 38 (1999), pp. L1291-1292, as fluorescent bodies intended to solve the aforementioned problems. These thiogallate-type fluorescent bodies are satisfactory from the standpoint of color purity. However, because the fluorescent bodies comprise multiple elements it is difficult to form thin-films with uniform compositions. The difficulty of controlling the composition leads to reduced crystallinity, generation of defects due to remove of sulfur, and inclusion of impurities. It is therefore assumed that the desired brightness cannot be achieved since high-quality thin-films are unobtainable. Both thiogallate-type fluorescent bodies and thioaluminate-type fluorescent bodies have relatively high film forming process temperatures of 750-900° C., particularly for the annealing temperatures after film formation. This has been the cause of numerous problems, such as a requirement for very high heat resistance of the base and restrictions on base materials, a tendency toward diffusion of elements from the base or adjacent layers (insulating layer, etc.) into the fluorescent thin-film, a tendency for lower flatness between layers, a tendency toward interlayer peeling during high-temperature annealing, a tendency toward collapse of picture elements due to surface diffusion during high-temperature annealing, and increased costs due to the need for heating strategies in annealing apparatuses for high-temperature annealing.

In addition, in order to realize full-color EL panels it is necessary to use fluorescent materials from which blue, green and red fluorescent bodies can be produced in a stable and economical manner. However, because the process temperatures of the aforementioned fluorescent thin-films differ according to their materials, the conditions for forming each of the fluorescent thin-films for obtaining the prescribed luminescent characteristics differ for full color panels wherein the three colors RGB must be situated in the panel; such panels have therefore been difficult to produce. Fluorescent bodies using thioaluminate-type materials and thiogallate-type materials in particular have high process temperatures as mentioned above, and therefore lowering of the process temperature is a desired aim. In other words, it is desirable to form and anneal high brightness-emitting red, blue and green fluorescent thin-film materials simultaneously and at low temperature.

Incidentally, one method of producing high-purity, high-quality sulfide fluorescent thin-films is a method of forming a sulfide fluorescent thin-film by sputtering using a sulfide sintered body as the target.

When a sulfide fluorescent thin-film is produced by sputtering, the compositional ratio of sulfur in the thin-film is lower than in the target, and a thin-film with insufficient sulfur is formed. Thus, methods for avoiding insufficient sulfur have been attempted, such as a method of compensating for insufficient sulfur by introducing $H_2S$ gas during the sputtering as described in SID 94 DIGEST page 129, or a method of annealing in a sulfur atmosphere after thin-film formation.

Nevertheless, the methods described above for avoiding insufficient sulfur are highly dependent on the sulfur supply conditions, and the conditions which yield sulfide thin-films with the desired composition and high crystallinity are limited. In addition, since $H_2S$ and sulfur are harmful gases, the processes for mass production of such thin-films require noxious gas removal equipment and safety measures, creating an excessive cost burden.

Sputtering targets used for formation of sulfide fluorescent thin-films by sputtering are described, for example, in Japanese Patent Application Laid-Open No. 2001-118677. This publication proposes a sputtering target for an inorganic EL fluorescent thin-film, comprising a matrix material composed mainly of a Group II-sulfur compound, a Group II-Group III-sulfur compound or a rare earth sulfide, and one or more from among magnesium sulfide (MgS), calcium sulfide (CaS) and zinc sulfide (ZnS) at 3-100 mole percent in terms of MgS, CaS and ZnS. As a specific example in this document there is disclosed creation of a sintering target using SrS as the matrix material and adding Zn thereto. The document also states that the use of a sputtering target with ZnS added eliminates sulfur insufficiency in the formed thin-film.

DISCLOSURE OF THE INVENTION

However, thiogallate-type and thioaluminate-type materials with satisfactory sintering properties are unknown, and even when these materials are fired it is difficult to obtain sintered bodies with adequate denseness to allow their use as sputtering targets. In addition, even if such sintered bodies could be produced, the sintered bodies of such materials are chemically unstable and readily react with moisture in the air, thus accelerating deterioration of the material from the sintered body surface.

It is an object of the present invention to provide a target which is used for formation of a ternary sulfide fluorescent thin-film such as thioaluminate or thiogallate by sputtering, which allows formation of fluorescent thin-films with an adequate level of high brightness, and which has excellent denseness and high stability.

The sputtering target for fluorescent thin-film formation according to the invention comprises a matrix material and a luminescent center material, and the chemical composition of the matrix material is represented by the following formula (1), where the conditions represented by the following inequalities (2) to (5) are simultaneously satisfied.

$$M^{II}{}_v A_x B_y O_z S_w \quad (1)$$

$$0.05 \leq v/x \leq 5 \quad (2)$$

$$1 \leq y/x \leq 6 \quad (3)$$

$$0.01 \leq z/(z+w) \leq 0.85 \quad (4)$$

$$0.6 \leq (v+x+3y/2)/(z+w) \leq 1.5 \quad (5)$$

In formula (1), $M^{II}$ represents one or more elements selected from the group consisting of Zn, Cd and Hg. A represents one or more elements selected from the group consisting of Mg, Ca, Sr, Ba and rare earth elements. B represents one or more elements selected from the group consisting of Al, Ga and In. The subscripts v, x, y, z and w each represent numerical values satisfying the conditions specified in inequalities (2) to (5).

In formula (1), z and w preferably represent numerical values satisfying the condition specified by the following inequality (4a).

$$0.01 \leq z/(z+w) \leq 0.5 \quad (4a)$$

As element $M^{II}$ there is preferably used at least Zn. The luminescent center material used is preferably Eu. Preferably element A is Ba and element B is Al. Also preferably, element A may be Sr and element B may be Ga.

The effect will now be explained using an example wherein Ba is used as element A, Al is used as element B and Zn is used as element $M^{II}$, or in more specific terms, wherein a matrix material is used having Zn(S,O) added to $BaAl_2(S,O)_4$. This effect is similar for other compositional systems encompassed within the scope of the invention.

When it is attempted to obtain a $BaAl_2S_4$:Eu thin-film by sputtering, the sputtering target used is usually a sintered body having Eu or its compound added to $BaAl_2S_4$. Investigation by the present inventors has revealed that the sintered body reacts with moisture in the air during the process of producing the sputtering target. Such sintered bodies have also been shown to have high levels of contamination and numerous cracks. The porosity of the sintered bodies clearly prevents them from having sufficient density. As a result of these findings, the present inventors determined that it is essentially impossible to obtain a sintered body with sufficiently effective function as a target from above-mentioned sulfide compound. This is attributed to the chemical instability of the $Al_2S_3$ starting material. When such a chemically unstable sintered body is nevertheless used as a target for sputtering, the composition of the resulting thin-film does not have a stoichiometric ratio of $S/(Ba+3/2Al)=1$ but rather, $S/(Ba+3/2Al)<1$, clearly producing a condition of stoichiometric sulfur insufficiency.

An example of the invention will now be explained, for the use of a sputtering target which is a sintered body comprising a matrix material, in the form of Zn(S,O) added to $BaAl_2(S,O)_4$, and Eu or its compound as the luminescent center. By using the oxysulfide $BaAl_2(S,O)_4$ as the matrix material of this sputtering target, instead of a conventional sulfide, the following effect can be obtained. Specifically, reaction between the sintered body and moisture in the air is inhibited, less contamination is included in the sintered body, cracks in the sintered body are suppressed and a high-density sintered body is obtained.

In addition, when forming a sputtering target of a matrix material composed solely of $BaAl_2(S,O)_4$, oxidation reaction of the target during sintering proceeds readily and the composition of the resulting sputtering target tends to have excess oxygen with respect to the stoichiometric ratio. However, by changing the composition of the sputtering target to one comprising Zn(S,O) in addition to $BaAl_2(S,O)_4$, oxidation of the target during sintering can be inhibited (and reduction reaction is promoted). The sputtering target of the invention therefore will not readily contain oxygen in excess of the stoichiometric ratio. Thus, since fluorescent thin-films formed using the target of the invention also will not readily contain oxygen in excess of the stoichiometric ratio, high-brightness luminescence can be achieved.

The Zn(S,O) in the sputtering target is the sulfur source of the $BaAl_2(S,O)_4$ thin-film formed from the sputtering target. Specifically, during sputtering the $BaAl_2(S,O)_4$ and Zn(S,O) in the target are supplied to the base surface as S, Zn, Zn(S,O), $BaAl_2(S,O)_4$, Ba, Ba(S,O), Al, $Al_2(S,O)_3$ and clusters thereof. A high temperature of the base during sputtering will cause re-evaporation of S, Zn, Zn(S,O) and their clusters at the base surface, resulting in an attachment coefficient of 1 or lower.

On the other hand, the attachment coefficient of $BaAl_2(S,O)_4$ and its clusters is approximately 1. The S, Zn and Zn(S,O) fly off and disperse on the base surface and re-evaporate, but during the surface diffusion the S component is supplied to the $BaAl_2(S,O)_4$ thin-film. Thus, it is possible to avoid the ordinarily occurring sulfur insufficiency, and obtain a thin-film containing virtually no Zn(S,O) and having a composition which is nearly $BaAl_2(S,O)_4$. In addition, since the vicinity of the thin-film surface is a reductive atmosphere during the aforementioned re-evaporation, the oxygen content of the formed thin-film can be reduced to below the oxygen content of the sputtering target. This facilitates control of the oxygen content of the thin-film to an appropriate range.

According to the invention, the characteristics of the sputtering target are improved, and it is also possible to improve the crystallinity of fluorescent thin-films formed using the target. As mentioned above, using the sputtering target of the invention allows a thin-film with a nearly stoichiometric composition of $BaAl_2(S,O)_4$ to be easily obtained, thus increasing the crystallinity. Surface diffusion of S, Zn, Sr, Zn(S,O), $BaAl_2(S,O)_4$, Ba, Ba(S,O), Al, $Al_2(S,O)_3$ and clusters thereof near the base surface during sputtering results in each of the elements being situated at stable crystalline sites, so that a thin-film with adequate high crystallinity is obtained. As an EL emits light under a high electrical field, it is necessary to increase the crystallinity of the matrix material in order to obtain a fluorescent thin-film which emits high-brightness luminescence. Using the sputtering target of the invention easily yields a fluorescent thin-film with high crystallinity.

The difference in the attachment coefficients of Zn(S,O) and $BaAl_2(S,O)_4$ at different temperatures is utilized to form a thin-film under conditions with a base temperature wherein only a portion of the Zn(S,O) re-evaporates, thereby allowing formation of a thin-film having a composition with a relatively large amount of Zn(S,O) added to the $BaAl_2(S,O)_4$ (hereinafter referred to as "mixed thin-film").

By using a sputtering target with Zn(S,O) added to a thioaluminate-type material or thiogallate-type material, it is possible to fabricate a fluorescent thin-film by a lower temperature process than the prior art. In the past, thioaluminate-type materials and thiogallate-type materials have required relatively high-temperature thin-film formation and annealing.

The present inventors formed a thin-film of $SrGa_2S_4$:Eu, which is an excellent green EL material, and performed annealing of the obtained thin-film at 700° C., a lower temperature than the prior art, to fabricate an EL element. However, the EL element did not exhibit the desired luminescence. The luminescent brightness of the fluorescent thin-film of this EL element was about 380 cd/m² with driving at 1 kHz, and the brightness was insufficient for use as an EL element panel.

Based on these results, the present inventors explored fluorescent materials which can produce sufficient brightness even with low temperature annealing of about 700° C. It was thereupon discovered that it is possible to realize a fluorescent thin-film emitting high brightness through a low temperature process, by using a material with a novel composition containing a thioaluminate-type material or thioaluminate-type material as the main component, and zinc sulfide as a secondary component. For example, when zinc sulfide is added to a strontium thiogallate-type material, controlling the Zn/Sr atomic ratio and Ga/Sr atomic ratio can result in sufficiently high brightness even if the annealing temperature is lowered.

It is believed that the process temperature can be lowered according to the invention because the crystallization temperature of the fluorescent thin-film is lowered. The mechanism by which the crystallization temperature is lowered is not fully understood at the present time. However, it has been reported that barium sulfide and zinc sulfide form a eutectic state at relatively low temperature. This suggests that when an alkaline earth element is used as element A, for example, sulfides of Group 13 elements such as Al or Ga or alkaline earth sulfides react or crystallize at low temperature, allowing low-temperature synthesis of crystals of alkaline earth thioaluminates or alkaline earth thiogallates. However, the mechanism is not limited to this one.

The present inventors have further discovered that the brightness is drastically enhanced and brightness life (driving life) is notably lengthened by adding a prescribed concentration of oxygen to a sulfide such as a thioaluminate-type material or thiogallate-type material containing added zinc sulfide, for conversion to an oxysulfide.

BEST MODE FOR CARRYING OUT THE INVENTION

Figure 1:
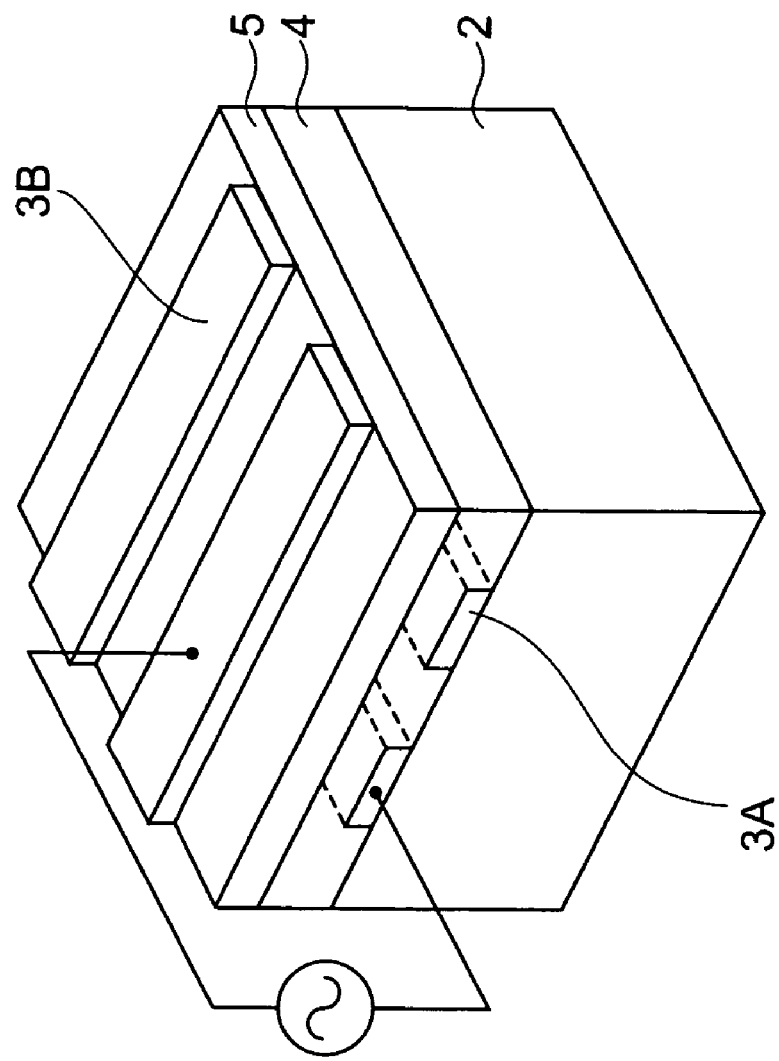
FIG. 1 is a perspective view showing the main elements of the basic structure of an EL element.

Embodiments of invention will now be explained in detail.

The target of the invention comprises a matrix material and a luminescent center. The chemical composition of the matrix material is represented by the following formula (1).

$$M^{II}_v A_x B_y O_z S_w \qquad (1)$$

In formula (1), $M^{II}$ represents one or more elements selected from the group consisting of Zn, Cd and Hg, A represents one or more elements selected from the group consisting of Mg, Ca, Sr, Ba and rare earth elements, and B represents one or more elements selected from the group consisting of Al, Ga and In.

The matrix material represented by formula (1) above may be considered to be an oxysulfide obtained by mixing or compounding a sulfide of element $M^{II}$ selected from among Group 12 elements with a sulfide composed of an alkaline earth thioaluminate, alkaline earth thiogallate, alkaline earth thioindate, rare earth thioaluminate, rare earth thiogallate or rare earth thioindate, or a mixture containing two or more thereof, and replacing a portion of the sulfur with oxygen. As explained above, a composition wherein an oxysulfide of element $M^{II}$ has been added to this type of oxysulfide allows a sputtering target (hereinafter, "target") to be obtained with satisfactory denseness and chemical stability and an appropriate oxygen concentration. This effect of element $M^{II}$ is particularly notable when Zn is used as element $M^{II}$, and therefore it is preferred to at least use Zn as $M^{II}$. More specifically, the atomic ratio in $M^{II}$ is preferably at least 10%, and more preferably 100%.

Element A is preferably at least one from among alkaline earth elements, particularly Ba and Sr, for emission of blue and green light, respectively. Any combination of element A and element B may be used, but for emission of blue and green light it is preferred to use either or both Al and Ga as element B. That is, the sulfide of element $M^{II}$ is preferably mixed or compounded with at least one from among alkaline earth thioaluminates, alkaline earth thiogallates and alkaline earth thioindates. In particular, at least one from among barium thioaluminate comprising Ba as element A and Al as element B, and strontium thiogallate comprising Sr as element A and Ga as element B is preferred. These compounds are preferred for application to the present invention because of their high crystallization temperatures, and most preferred are barium thioaluminate with Eu added as the luminescent center, and strontium thiogallate with Eu added as the luminescent center. These combinations are particularly effective for high-brightness emission of blue and green light, at a high degree of purity of each color. A portion of the alkaline earth elements in these preferred sulfides are also preferably replaced with rare earth elements.

An example of using Zn as element $M^{II}$ and primarily an alkaline earth element as element A will now be explained in detail.

The Zn content of the target may be appropriately determined depending on the target firing conditions and the various conditions during sputtering, and particularly the base temperature, but formula (1) above must be such that the following inequality:

$$0.05 \leq v/x \leq 5 \quad (2)$$

is satisfied. In addition, the Zn content of the target is preferably determined so that the following inequality:

$$0.1 \leq v/x \leq 4 \quad (2a)$$

is satisfied, and more preferably so that the following inequality:

$$0.5 \leq v/x \leq 1.5 \quad (2b)$$

is satisfied. If v/x is below the aforementioned lower limit, i.e., if the Zn content is too low, the effect of Zn addition is not adequately exhibited. On the other hand, if v/x is above the aforementioned upper limit, i.e. if the Zn content is too high, the crystallinity of the matrix material crystal in the formed fluorescent thin-film is impaired and it becomes difficult to obtain high-brightness luminescence independent of the annealing temperature. Even without an excessive amount of Zn in the fluorescent thin-film, the ZnS which has not become incorporated in the thin-film can lead to undesirable residue and contamination in the film-forming apparatus.

More specifically, when the goal is to form the aforementioned mixed thin-film, such as a $BaAl_2(S,O)_4$ and $Zn(S,O)$ mixed thin-film, it is sufficient to have a relatively high $Zn(S,O)$ content in the target, and for example, sputtering may be carried out with $v/x \geq 1.5$ and preferably $v/x \geq 2.0$, and with the base temperature preferably at below 250° C. In this case, the Zn in the target will be present in the fluorescent thin-film at a proportion roughly similar to the target, or in a slightly lower proportion than in the target.

On the other hand, when the goal is to form a thin-film with a low $Zn(S,O)$ content for a composition approaching $BaAl_2(S,O)_4$, it is sufficient to have a relatively low $Zn(S,O)$ content in the target. For example, sputtering may be carried out with the $Zn(S,O)$ content in the target such that $v/x \leq 1.4$ and preferably $v/x \leq 1.0$, with the base temperature preferably set to 250° C. or above.

The relationship between x and y in formula (1) above must satisfy the inequality:

$$1 \leq y/x \leq 6 \quad (3)$$

preferably the inequality:

$$1.5 \leq y/x \leq 3 \quad (3a)$$

more preferably the inequality:

$$2.0 \leq y/x \leq 2.99 \quad (3b)$$

and even more preferably the inequality:

$$2.10 \leq y/x \leq 2.90 \quad (3c)$$

Adding Zn, with y/x within this range, will further enhance the luminescent brightness when low temperature annealing is performed.

A target with a composition comprising a mixture of oxygen and sulfur is dense and resistant to reaction with moisture in the air, and it is therefore easy to manage. Also, since the obtained highly dense sintered body has low contamination and is resistant to cracking, fluorescent thin-films formed by sputtering using such targets are of high quality. Moreover, introduction of an appropriate amount of oxygen in the fluorescent thin-film enhances the brightness and usable life while also preventing brightness deterioration. When oxygen is added to a thin-film containing the aforementioned ternary sulfide (A-B-S) as the matrix material, crystallization is accelerated during the matrix material film formation or the post-processing such as annealing after film formation. Also, the luminescent center material (rare earth element) added to the thin-film presumably has an effective transition in the compound crystal field, yielding high-brightness emission. Furthermore, inclusion of oxygen compounds results in greater chemical stability in air, compared to matrix materials which are pure sulfides. The oxide components therefore protect the luminescent components from the air. However, while a higher oxygen content results in a longer brightness life, an excessively high oxygen content will reduce the brightness.

In order to realize a highly dense target with satisfactory chemical stability which allows formation of high-brightness fluorescent thin-films, the oxygen concentration of the matrix material is preferably controlled so that the relationship between z and w in formula (1) satisfies the inequality:

$$0.01 \leq z/(z+w) \leq 0.85 \quad (4)$$

preferably the inequality:

$$0.01 \leq z/(z+w) \leq 0.5 \quad (4a)$$

and more preferably the inequality:

$$0.05 \leq z/(z+w) \leq 0.5 \quad (4b).$$

The target is preferably crystalline, but it may be in an amorphous state with no clear crystal structure.

The crystals in the target are preferably one or more types from among $A_5B_2(O,S)_8$, $A_4B_2(O,S)_7$, $A_2B_2(O,S)_5$, $AB_2(O,S)_4$, $AB_4(O,S)_7$, $A_4B_{14}(O,S)_{25}$, $AB_8(O,S)_{13}$ and $AB_{12}(O,S)_{19}$. At least a portion of the Zn in the target may be present as ZnS, it may be present in the aforementioned crystal in a form replacing at least a portion of element A and/or element B, it may be present in another crystal (for example, an orthorhombic crystal) containing Zn, A and B, or it may be present in any two or more of these forms.

In the case of a compound wherein $Zn_vA_xB_yO_zS_w$ is in a stoichiometric ratio, the compound may contain $Zn(O,S)$, $A(O,S)$ and $B_2(O,S)_3$ in the proportion $v:x:(y/2)$. Thus, the composition is essentially stoichiometric when $z+w=v+x+3y/2$. In order to obtain high-brightness luminescence, the composition of the target must be close to the stoichiometric ratio, and specifically, the following inequality must be satisfied.

$$0.6 \leq (v+x+3y/2)/(z+w) \leq 1.5 \quad (5)$$

The element added as the luminescent center is preferably a rare earth element. The rare earth element is selected at least from among Sc, Y, La, Ce, Pr, Nd, Gd, Tb, Ho, Er, Tm, Lu, Sm, Eu, Dy and Yb. A luminescent center combined with a barium thioaluminate matrix material is preferably Eu for a blue fluorescent body, Ce, Tb or Ho for a green fluorescent body or Sm, Yb or Nd for a red fluorescent body. Eu is preferably used among these because it produces the strongest luminescence when combined with the matrix material used for the invention. A combination of a strontium thiogallate matrix material with Eu produces a green fluorescent body, and a combination of a strontium thioindate matrix material or barium thioindate matrix material with Eu produces a red fluorescent body.

The content of the element serving as the luminescent center in the fluorescent thin-film is preferably 0.5-10 atomic percent with respect to element A in formula (1). The content of the luminescent center in the fluorescent thin-film formed by sputtering will differ from the content of the luminescent center in the target used for its formation. The content of the luminescent center in the target may therefore be adjusted to give the prescribed content of the luminescent center in the fluorescent thin-film, and normally this will also be 0.5-10 atomic percent in the target with respect to element A.

The target may also contain trace additives and unavoidable impurities, in addition to the aforementioned matrix material and luminescent center. As examples of trace additives or unavoidable impurities there may be mentioned one or more elements selected from the group consisting of B, C, Si, P, Cl, As, Se, Br, Te, I, Li, Na, Rb, Cs, Ge, Sn, Sb, Tl, Pb, Bi, Sc, Ti, V, Cr, Mn, Fe, Co, Y, Zr, Nb, Mo, Tc, Ru, Rh, Pd, Ag, Hf, Ta, W, Re, Os, Ir, Pt and Au. However, in order to minimize an adverse effect on the fluorescent characteristics such as brightness, the total amount of these elements in the target is preferably no greater than 0.05 atomic percent, and especially no greater than 0.01 atomic percent.

The composition of the target can be confirmed by X-ray fluorescent analysis (XRF), X-ray photoelectron spectroscopy (XPS) or the like.

A process for production of the target will now be explained. The target is produced by molding and sintering the raw material powder.

The raw material powder may be appropriately selected from among raw materials for $M^{II}S$ such as ZnS, for AS such as BaS, for $B_2S_3$ such as $Al_2S_3$, for $AB_2S_4$ such as $BaAl_2S_4$ and for the luminescent center such as EuS, as well as other compounds. Oxygen may be included in the raw material powder, and an oxide may be used as one or more of the raw materials. The raw material powder is preferably mixed in an oxidizing atmosphere such as air, for introduction of oxygen into the raw material powder.

The sintering may be carried out at ordinary pressure, but is preferably carried out under pressurization. For pressurized sintering there is preferably employed a hot press method or hot hydrostatic press method, and a hot press method is most preferred. The pressure, temperature and firing time for pressurized sintering may be determined so as to obtain a dense sintered body, but in most cases a pressure of 5 MPa or greater, a temperature of 500-1500° C. and a firing time of 10-300 minutes are preferred. If the pressure is below 5 MPa, the temperature is below 500° C. or the firing time is shorter than 10 minutes, it tends to be difficult to obtain a dense sintered body. On the other hand, if the temperature is above 1500° C. or the firing time is longer than 300 minutes, the oxygen content of the target will tend to be too great. There is no particular upper limit for the pressurization force, but when an ordinary carbon die is used as the molding frame in a hot press method, usually it is preferably no greater than 60 MPa. For a hot hydrostatic press method, it is preferably no greater than 200 MPa. The atmosphere for sintering is preferably non-oxidizing, in order to avoid oxidation of the target during sintering and preferably for reduction. The non-oxidizing atmosphere may be a vacuum, an inert gas such as a rare gas or nitrogen, or a sulfur-containing gas such as $H_2S$.

The conditions for sputtering using the target of the invention will now be explained. The following example assumes the use of Zn for element $M^{II}$.

As mentioned above, setting the conditions so that Zn(O,S) re-evaporates during sputtering will allow effective supply of sulfur from the Zn(O,S) to the fluorescent thin-film and high crystallization of the fluorescent thin-film. For re-evaporation of Zn(O,S), the base temperature during sputtering is preferably 250-800° C., more preferably 350-700° C. and even more preferably 450-600° C. A base temperature of higher than 800° C. tends to produce a fluorescent thin-film surface with severe irregularities, generate pinholes in the thin-film and create the problem of current leaks in the EL element. The base temperature therefore preferably does not exceeds this upper limit.

On the other hand, re-evaporation of Zn(O,S) at the base surface can be inhibited if the base temperature during sputtering is relatively low, such as below 250° C. In this case, sulfur is supplied from the Zn(O,S) to the matrix material of the fluorescent thin-film while the Zn(O,S) itself is incorporated into the fluorescent thin-film, thus forming the mixed thin-film described above.

The atmosphere for sputtering may be a rare gas atmosphere such as Ar. Since using the target of the invention helps prevent sulfur insufficiency in the formed thin-film, there is no need to introduce $H_2S$ gas into the atmosphere. However, $H_2S$ gas may be optionally introduced. There are no particular restrictions on the atmosphere pressure during sputtering, and it may usually be set as appropriate in a range of 0.2-10 Pa.

Annealing is preferably carried out after the fluorescent thin-film has been formed, in order to improve the crystallinity of the thin-film and adjust the composition of the thin-film. The atmosphere for annealing may be appropriately selected, depending on the purpose, from among a vacuum, reductive atmospheres such as $N_2$ or Ar, oxidizing atmospheres such as air, or S vapor, $H_2S$ or the like. Since using the target of the invention helps prevent sulfur insufficiency in the formed thin-film, the atmosphere does not need to contain sulfur. Annealing in an oxidizing atmosphere is effective for introducing oxygen into the thin-film and easily obtaining a matrix material having the preferred composition described above. The oxidizing atmosphere is preferably air or an atmosphere with a higher oxygen concentration than air.

The annealing temperature will usually be set in the range of 500-1000° C., and especially 600-800° C. According to the invention, sufficiently high-brightness luminescence can be achieved even with an annealing temperature of below 750° C., and even less than or equal to 700° C. The brightness-enhancing effect by improvement of the crystallinity will tend to be insufficient if the annealing temperature is lower than 500° C.

The annealing time will usually be 1-60 minutes, and preferably 5-30 minutes. If the annealing time is shorter than 1 minute the effect of annealing tends not to be adequately exhibited. On the other hand, if the annealing time is longer than 60 minutes, the effect of annealing tends not to increase to any notable extent, while the structural elements other than the fluorescent thin-film (the electrodes, base, etc.) may sustain damage with prolonged heating.

The film thickness of the fluorescent thin-film formed using the target of the invention is not particularly restricted, but an excessive thickness increases the driving voltage while an insufficient thickness tends to reduce the luminescent efficiency. The thickness of the fluorescent thin-film is preferably 50-700 nm and more preferably 100-300 nm. A film thickness in this range will yield a fluorescent thin-film with further enhanced brightness and luminescent efficiency.

A fluorescent thin-film in an EL element will now be described.

A fluorescent thin-film formed using the target of the invention is preferably sandwiched on both sides by zinc sulfide (ZnS) thin-films of the EL element. That is, the EL element preferably has a ZnS thin-film/fluorescent thin-film/ZnS thin-film laminated structure. By sandwiching the fluorescent thin-film with ZnS thin-films, the charge injection characteristic and voltage resistance characteristic of the fluorescent thin-film are improved, and it is possible to obtain a high-brightness EL element with an easily drivable application voltage of under 200 V. The thickness of each of the ZnS thin-films is preferably 30-400 nm, and more preferably 100-300 nm.

When a ZnS thin-film is provided, there is no limitation to the aforementioned trilayer structure, and it may instead be an alternating laminated structure of the ZnS thin-film and the fluorescent thin-film with ZnS thin-films as the outer layers of the laminate, such as ZnS thin-film/fluorescent thin-film/ZnS thin-film/fluorescent thin-film/ZnS thin-film. Alternatively, a laminate composed of the three layers ZnS thin-film/fluorescent thin-film/ZnS thin-film may be used as a single unit, and a structure formed by laminating several units. Also preferred is a structure wherein thin-films composed of an oxide such as $Al_2O_3$ or a nitride are formed on both sides of the ZnS thin-film/fluorescent thin-film/ZnS thin-film structure. When the thickness of such thin-films is as small as about 50 nm, the combination with the ZnS thin-films provides an injection layer function for electrons into the fluorescent thin-film, mainly for high-brightness emission. Also, a thin-film composed of $Al_2O_3$ or the like also functions as a cap layer to control the amount of oxygen introduced from the atmosphere into the fluorescent thin-film during the annealing in an oxidizing atmosphere described below. The thickness of a thin-film composed of $Al_2O_3$ or the like is preferably 5-150 nm, and more preferably 10-100 nm.

Figure 2:
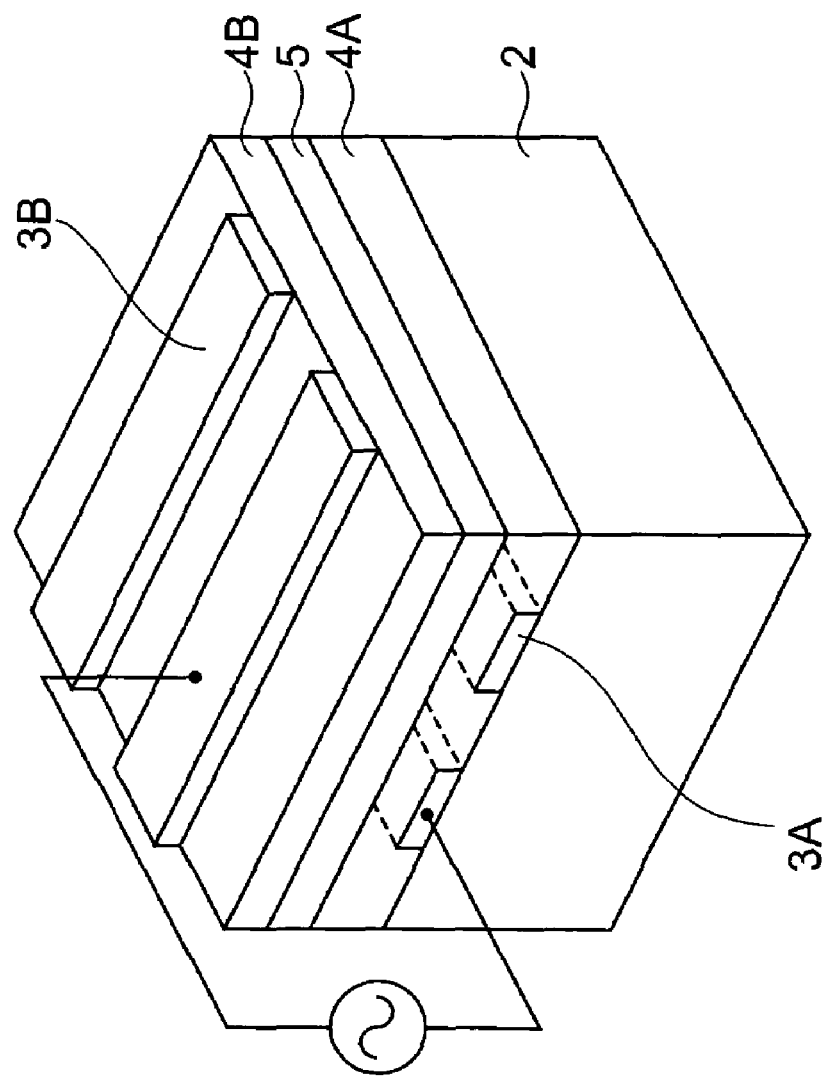
FIG. 2 is a perspective view showing the main elements of the basic structure of an EL element with a double insulating layer-type structure.

For construction of the EL element, the luminescent layer 5 in the bilayer insulating structure shown in FIG. 2 may be a fluorescent thin-film, or the aforementioned laminated body comprising a fluorescent thin-film, ZnS thin-film and $Al_2O_3$ thin-film. Alternatively, a fluorescent thin-film, or the aforementioned laminated body composed of a fluorescent thin-film, ZnS thin-film and $Al_2O_3$ thin-film, may be used as the luminescent layer in a structure having an insulating layer made of a thick-film or thin-sheet dielectric layer provided on only one side, as described above.

Intermediate layers may also be provided between each of the adjacent insulating, luminescent and electrode layers of the EL element, such as layers for improved cohesion, layers for stress alleviation and layers for reaction control. The thick-film surface may also be subjected to polishing or provided with a flattening layer, to improve the flatness.

For example, a dielectric layer formed by a solution coating/firing method may be formed on the lower insulating layer 4A in FIG. 2, for flattening. Solution coating/firing methods are methods in which a precursor solution of a dielectric material is coated onto a substrate and a dielectric layer is formed by firing, and they include sol-gel methods and MOD (Metallo-Organic Decomposition).

When it is necessary to control diffusion of elements from the thick-film insulating layer to the fluorescent thin-film, it is preferred to form a barrier layer made of $BaTiO_3$, for example, between the thick-film insulating layer and the fluorescent thin-film.

The material used for the base is not particularly restricted so long as its heat-resistant temperature or melting point is preferably 600° C. or higher, more preferably 700° C. or higher and even more preferably 800° C. or higher, so that it can withstand the temperatures for formation of each layer of the EL element and the annealing temperature for the EL element, and so long as an EL element can be formed thereover by a functional thin-film such as a luminescent layer, and the prescribed strength can be maintained.

Specifically, there may be mentioned glass, ceramic bases such as alumina ($Al_2O_3$), forsterite ($2MgO.SiO_2$), steatite ($MgO.SiO_2$), mullite ($3Al_2O_3.2SiO_2$), beryllia (BeO), aluminum nitride (AlN), silicon nitride ($Si_3N_4$) and silicon carbide (SiC+BeO), and heat-resistant glass bases made of crystalline glass. Particularly preferred among these are alumina bases and crystallized glass because their heat-resistant temperatures are above approximately 1000° C., while beryllia, aluminum nitride and silicon carbide are preferred when thermal conductivity is required. In addition, there may be used quartz, thermally oxidized silicon wafers, or metal bases made of titanium, stainless steel, inconel or iron. When a conductive base such as metal is used, a structure is preferred wherein a thick-film with an internal electrode is formed on the base. However, since the fluorescent thin-film to be formed using the target of the invention can be annealed at low temperature, the base used may have a relatively low heat-resistant temperature or melting point, matching the annealing temperature.

The material used for the dielectric thick-film (lower insulating layer) may be any publicly known dielectric thick-film material. The material preferably has a relatively high specific permittivity, and for example, materials such as lead titanate, lead niobate and barium titanate are preferred. The resistivity of the dielectric thick-film is preferably $10^8$ Ω·cm or greater and especially about $10^{10}$-$10^8$ Ω·cm. The material preferably has a relatively high specific permittivity ε, which is preferred to be between about 100-10,000. The thickness of the dielectric thick-film is preferably 5-50 μm and most preferably 10-30 μm.

The method for forming the dielectric thick-film is not particularly restricted so long as it is a method which can relatively easily produce a film with the prescribed thickness, but sol-gel methods and printing/firing methods are preferred. When a printing/firing method is employed, the material is adjusted to an appropriate particle size and mixed with a binder to form a paste of suitable viscosity. The paste is applied and dried on a base by a screen printing method to prepare a green sheet. The green sheet is fired at an appropriate temperature to obtain a thick-film.

The constituent material of the thin-film insulating layer (upper insulating layer) may be, for example, silicon dioxide ($SiO_2$), silicon nitride ($Si_3N_4$), tantalum oxide ($Ta_2O_5$), strontium titanate ($SrTiO_3$), yttrium oxide ($Y_2O_3$), barium titanate ($BaTiO_3$), lead titanate ($PbTiO_3$), PZT, zirconia ($ZrO_2$), silicon oxynitride (SiON), alumina ($Al_2O_3$), lead niobate or a PMN-PT based material, or a multilayer or mixed thin-film of these materials.

The method for forming the insulating layer using such materials may be an existing method such as vapor deposition, sputtering or CVD. The film thickness of the insulating layer in this case is preferably 50-1000 nm and especially about 100-500 nm.

The lower electrode is usually formed in a manner embedded in the lower insulating layer. The lower electrode is exposed to high temperature during heat treatment of the luminescent layer, and when the lower insulating layer is formed by a thick-film method, it is also exposed to high temperature during the lower insulating layer formation. Therefore, the lower electrode preferably has excellent heat resistance, and specifically a metal electrode is preferred. The metal electrode may be any commonly used metal electrode comprising one or more main components such as palladium (Pd), rhodium (Rh), iridium (Ir), rhenium (Re), ruthenium (Ru), platinum (Pt), silver (Ag), tantalum (Ta), nickel (Ni), chromium (Cr) or titanium (Ti).

On the other hand, since light is emitted from the side opposite the base, the upper electrode is usually preferred to be an electrode which is transparent in the prescribed luminescent wavelength region, such as a transparent electrode composed of ZnO, ITO or IZO, for example. ITO normally comprises $In_2O_3$ and SnO in a stoichiometric composition, but the O content may deviate somewhat. The mixing ratio of $SnO_2$ with respect to $In_2O_3$ is preferably 1-20 wt % and more preferably 5-12 wt %. The mixing ratio of ZnO with respect to $In_2O_3$ in IZO will normally be about 12-32 wt %. When a transparent base is used and light is emitted from the base side, the lower electrode is a transparent electrode.

The electrode may also contain silicon as the major component. Such a silicon electrode may be polycrystalline silicon (p-Si) or amorphous silicon (a-Si), and if necessary it may even be monocrystalline silicon. The silicon electrode is doped with an impurity to ensure conductivity. The dopant used as the impurity may be any one which can ensure the prescribed conductivity, and may be any ordinary dopant used for silicon semiconductors. Specifically, B, P, As, Sb and Al are preferred. The dopant concentration is preferably about 0.001-5 atomic percent.

The method of forming the electrode may be appropriately selected from among existing methods such as vapor deposition, sputtering, CVD, sol-gel methods and printing/firing methods. Particularly in the case of a structure provided with a dielectric thick-film containing the electrode in the interior, the electrode is preferably formed by the same method as the dielectric thick-film.

The resistivity of the electrode is preferably no greater than 1 Ω·cm and more preferably 0.003-0.1 Ω·cm, in order to efficiently impart an electric field to the luminescent layer. The film thickness of the electrode will differ depending on the structural material of the electrode, but is preferably 50-2000 nm and more preferably about 100-1000 nm.

EXAMPLES

Specific examples of the present invention will now be explained for more detailed description of the invention.

Example 1

An EL element (EL panel) based on the structure shown in FIG. 1 was fabricated by the following procedure.

The base 2 and insulating layer 4 were both constructed from a $BaTiO_3$—$PbTiO_3$-based dielectric material (specific permittivity: 5000), and the lower electrode 3A was constructed from Pd. First, a sheet serving as the base 2 was prepared, and pastes for the lower electrode 3A and insulating layer 4 were screen printed thereover to form a green sheet, and were simultaneously fired. Next, the insulating layer 4 surface was polished to a thickness of 30 μm. A barrier layer composed of a 400 nm $BaTiO_3$ film was then formed on the insulating layer 4 by sputtering, and then annealed in air at 700° C.

A laminated thin-film comprising the structure: $Al_2O_3$ thin-film (20 nm)/ZnS thin-film (100 nm)/fluorescent thin-film (200 nm)/ZnS thin-film (100 nm)/$Al_2O_3$ thin-film (30 nm) was formed as a luminescent layer 5 on the barrier layer. The numerical values in parentheses are the film thicknesses, and each thin-film was formed by vapor deposition.

The fluorescent thin-film was formed by a sputtering method. The target used for sputtering was obtained by hot pressing a mixture of ZnS, BaS, $Al_2S_3$ and EuS as the starting powder. The mixing was carried out in air for introduction of oxygen into the starting powder. The hot pressing was carried out for 1 hour in an Ar atmosphere at a pressure of 30 MPa and a temperature of 1000° C. The chemical composition of the matrix material in the target was as follows, based on the formula: $Zn_vBa_xAl_yO_zS_w$:

$v/x=1$ $y/x=3.05$ $z/(z+w)=0.21$ $(v+x+3y/2)/(z+w)=0.95$

This target was used to form a fluorescent thin-film by an RF magnetron sputtering method in an Ar atmosphere, with the base temperature set to 350° C.

After formation of the laminated thin-film, it was annealed for 10 minutes in air at 700° C.

For measurement of the composition, the laminated thin-film was also formed onto an Si base and annealed. The formation and annealing conditions for this laminated thin-film were the same as for the laminated thin-film in the EL element. As a result of compositional analysis of the fluorescent thin-film in the laminated thin-film by fluorescent X-ray analysis, the atomic ratio for $Zn_vBa_xAl_yO_zS_w$:Eu was $v/x=0.07$ $y/x=2.70$ $z/(z+w)=0.05$ $(v+x+3y/2)/(z+w)=1.04.$ The amount of Eu added was 5.1 atomic percent with respect to Ba. It was confirmed beforehand that the composition of the fluorescent thin-film for compositional measurement was the same as the composition of the fluorescent thin-film in the EL element. These results indicated that the Zn content of the thin-film was significantly lower than in the target, that re-evaporation had occurred on the base surface and that virtually no Zn had been incorporated into the thin-film.

Next, a 200 nm thick ITO transparent electrode (upper electrode 3B) was formed on the upper layer $Al_2O_3$ thin-film at a base temperature of 250° C. by RF magnetron sputtering using an ITO target.

Electrodes were drawn out from the upper electrode and lower electrode of the EL element, and the luminescent characteristics were measured by application of a bipolar field with a pulse width of 50 μs at 120 Hz, upon which blue emission with a brightness of 100 cd/m² was obtained with satisfactory reproducibility.

For comparison, a target was fabricated in the same manner as above, except that the starting powder was mixed in a globe box with a $N_2$ atmosphere. With this target, $z/(z+w)$ was 0.001. The target was highly chemically unstable after fabrication, while a mere 10 minutes of standing in air resulted in a strong irritating odor due to $H_2S$ release, coloration of the surface and appearance of cracking, and it was therefore unsuitable as a sputtering target.

Example 2

An EL element for Example 2 was fabricated in the same manner as Example 1, except that the base temperature was 150° C. for formation of the fluorescent thin-film by sputtering, and the annealing temperature was 650° C. for the annealing after formation of the fluorescent thin-film.

Upon measuring the composition of the fluorescent thin-film of the EL element in the same manner as Example 1, the atomic ratio for $Zn_vBa_xAl_yO_zS_w$:Eu was found to be as follows:

$v/x=0.15$ $y/x=2.30$ $z/(z+w)=0.10$ $(v+x+3y/2)/(z+w)=1.05.$

The amount of Eu added was 5 atomic percent with respect to Ba.

The luminescent characteristics of this EL element were measured in the same manner as Example 1, and blue emission with a brightness of 70 cd/cm² was obtained with good reproducibility. As a comparative example, an EL element was obtained by fabricating a $BaAl_2(S,O)_4$ target containing no Zn, and using this to form the fluorescent thin-film. This fluorescent thin-film was also annealed for 10 minutes in air at 650° C. The emission of the EL element of this comparative example was not blue but rather dark orange light with a brightness of a few cd/m². These results demonstrated that with formation of a fluorescent thin-film at a low base temperature of 150° C. and low temperature annealing at 650° C., the present invention produces blue emission with significantly higher brightness than is possible by the prior art.

INDUSTRIAL APPLICABILITY

The present invention provides a target for a sputtering method to form of a fluorescent thin-film comprising a matrix material composed mainly of a compound sulfide containing a Group 2 element and a Group 13 element ($BaAl_2S_4$, etc.).

The sputtering target for fluorescent thin-film formation according to the invention is an oxysulfide comprising a Group 2 element and a Group 13 element, as well as a Group 12 element $M^{II}$. This composition yields a dense target with high stability, capable of forming a high-brightness fluorescent thin-film.

Using this target eliminates the need for introduction of sulfur-containing gas during sputtering, while also eliminating the need for annealing in sulfur-containing gas after thin-film formation. Thus, safety measures such as noxious gas-removal equipment are unnecessary.

An oxysulfide thin-film formed using the target of the invention has high crystallinity and excellent luminescent brightness, luminescent efficiency and color purity.

A fluorescent thin-film formed using the target of the invention can be utilized in various El panels, and for example, are suitable for display full-color panels, multicolor panels and partially color panels.

The invention claimed is:

1. A sputtering target for fluorescent thin-film formation comprising a matrix material and a luminescent center material, wherein said matrix material has a chemical composition represented by the following formula (1), and simultaneously satisfies conditions represented by the following inequalities (2) to (5)

$$M^{II}_v A_x B_y O_z S_w \qquad (1)$$

$$0.05 \leq v/x \leq 5 \qquad (2)$$

$$1 \leq y/x \leq 6 \qquad (3)$$

$$0.01 \leq z/(z+w) \leq 0.85 \qquad (4)$$

$$0.6 \leq (v+x+3y/2)/(z+w) \leq 1.5 \qquad (5)$$

wherein $M^{II}$ represents one or more elements selected from the group consisting of Zn, Cd and Hg, A represents one or more elements selected from the group consisting of Mg, Ca, Sr, Ba and rare earth elements, B represents one or more elements selected from the group consisting of Al and In, and v, x, y, z and w each represent numerical values satisfying the conditions specified in the inequalities (2) to (5).

2. A sputtering target for fluorescent thin-film formation according to claim 1, wherein z and w in formula (1) represent numerical values satisfying the condition represented by the following inequality (4a)

$$0.01 \leq z/(z+w) \leq 0.5 \qquad (4a).$$

3. A sputtering target for fluorescent thin-film formation comprising a matrix material and a luminescent center material, wherein said matrix material has a chemical composition represented by the following formula (1), and simultaneously satisfies conditions represented by the following inequalities (2) to (5)

$$M^{II}_v A_x B_y O_z S_w \qquad (1)$$

$$0.05 \leq v/x \leq 5 \qquad (2)$$

$$1 \leq y/x \leq 6 \qquad (3)$$

$$0.12 \leq z/(z+w) \leq 0.85 \qquad (4)$$

$$0.6 \leq (v+x+3y/2)/(z+w) \leq 1.5 \qquad (5)$$

wherein $M^{II}$ represents one or more elements selected from the group consisting of Zn, Cd and Hg, A represents one or more elements selected from the group consisting of Mg, Ca, Sr, Ba and rare earth elements, B represents one or more elements selected from the group consisting of Al, Ga and In, and v, x, y, z and w each represent numerical values satisfying the conditions specified in the inequalities (2) to (5).

4. A sputtering target for fluorescent thin-film formation according to claim 3, wherein z and w in formula (1) represent numerical values satisfying the condition represented by the following inequality (4a)

$$0.12 \leq z/(z+w) \leq 0.85 \qquad (4a).$$

* * * * *